(12) United States Patent
Kinoshita et al.

(10) Patent No.: US 10,319,820 B2
(45) Date of Patent: Jun. 11, 2019

(54) SEMICONDUCTOR DEVICE HAVING SILICON CARBIDE LAYER PROVIDED ON SILICON CARBIDE SUBSTRATE

(71) Applicant: FUJI ELECTRIC CO., LTD., Kawasaki-shi, Kanagawa (JP)

(72) Inventors: Akimasa Kinoshita, Matsumoto (JP); Yasuyuki Hoshi, Matsumoto (JP); Yasuhiko Oonishi, Matsumoto (JP); Yuichi Harada, Matsumoto (JP)

(73) Assignee: FUJI ELECTRIC CO., LTD., Kawasaki-Shi, Kanagawa (JP)

(*) Notice: Subject to any disclaimer, the term of this patent is extended or adjusted under 35 U.S.C. 154(b) by 0 days.

(21) Appl. No.: 15/716,992

(22) Filed: Sep. 27, 2017

(65) Prior Publication Data

US 2018/0114836 A1 Apr. 26, 2018

(30) Foreign Application Priority Data

Oct. 21, 2016 (JP) .................... 2016-207406

(51) Int. Cl.
*H01L 29/16* (2006.01)
*H01L 29/04* (2006.01)
*H01L 29/417* (2006.01)
*H01L 29/66* (2006.01)
*H01L 29/78* (2006.01)

(52) U.S. Cl.
CPC ........ *H01L 29/1608* (2013.01); *H01L 29/045* (2013.01); *H01L 29/41741* (2013.01); *H01L 29/66068* (2013.01); *H01L 29/66712* (2013.01); *H01L 29/7802* (2013.01); *H01L 29/7827* (2013.01)

(58) Field of Classification Search
CPC .......... H01L 29/1608; H01L 29/66068; H01L 29/7802; H01L 29/66712; H01L 29/0696; H01L 29/1095; H01L 29/7395; H01L 29/66007
See application file for complete search history.

(56) References Cited

U.S. PATENT DOCUMENTS

| | | | | |
|---|---|---|---|---|
| 7,436,004 B2* | 10/2008 | Shimoida | ............ | H01L 29/0834 257/107 |
| 7,795,691 B2* | 9/2010 | Zhang | ................. | H01L 29/1095 257/402 |
| 8,786,024 B2* | 7/2014 | Sugawara | ........... | H01L 29/0661 257/256 |

(Continued)

FOREIGN PATENT DOCUMENTS

| | | |
|---|---|---|
| JP | H05-55594 A | 3/1993 |
| JP | 2009-094203 A | 4/2009 |

*Primary Examiner* — Khiem D Nguyen
(74) *Attorney, Agent, or Firm* — Rabin & Berdo, P.C.

(57) ABSTRACT

A semiconductor device includes a silicon carbide semiconductor substrate, a first silicon carbide layer of a first conductivity type, a first semiconductor region of a second conductivity type, a second semiconductor region of the first conductivity type, a third semiconductor region of the second conductivity type, a gate insulating film, a gate electrode, an interlayer insulating film, a source electrode, and a drain electrode. The third semiconductor region is thicker than the second semiconductor region and a width of a side of the third semiconductor region facing the first semiconductor region is narrower than a width of a side thereof facing the source electrode.

13 Claims, 9 Drawing Sheets

(56) References Cited

U.S. PATENT DOCUMENTS

| | | | |
|---|---|---|---|
| 2009/0090920 A1* | 4/2009 | Endo | H01L 29/872 257/77 |
| 2015/0084068 A1* | 3/2015 | Shimizu | H01L 21/045 257/77 |
| 2015/0287777 A1* | 10/2015 | Kumagai | H01L 29/0615 257/77 |

* cited by examiner

SEMICONDUCTOR DEVICE HAVING SILICON CARBIDE LAYER PROVIDED ON SILICON CARBIDE SUBSTRATE

CROSS REFERENCE TO RELATED APPLICATIONS

This application is based upon and claims the benefit of priority of the prior Japanese Patent Application No. 2016-207406, filed on Oct. 21, 2016, the entire contents of which are incorporated herein by reference.

BACKGROUND OF THE INVENTION

1. Field of the Invention

Embodiments of the invention are related to a semiconductor device and a method of manufacturing a semiconductor device.

2. Description of the Related Art

In a conventional vertical metal oxide semiconductor field effect transistor (MOSFET) that is a switching device using silicon carbide (SiC), a silicon carbide layer of a first conductivity type and having a low impurity concentration is formed on a surface of a silicon carbide substrate of the first conductivity type. A gate structure and a source structure are formed on a surface side of the silicon carbide layer, and a drain structure is formed on a first side of the silicon carbide substrate opposite a second side having the silicon carbide layer. The source structure is surrounded by a base region of a second conductivity type and a source electrode is bonded to the base region and a source region of the first conductivity type.

In a vertical MOSFET, when breakdown occurs during high voltage operation, a large current flows. By the occurrence of breakdown in an active region having an area larger than an edge termination region surrounding an active region in which an element structure is formed and through which current flows in the ON state, the vertical MOSFET reduces the absorption energy per unit area thereby increases tolerance. For such reasons, in general, a structure is designed enabling breakdown to occur easily in the active region. In the active region, a corner portion (e.g., reference numeral 201 in FIG. 1 and reference numeral 202 in FIG. 6 described hereinafter) of a base region in a Junction FET (JFET) region is formed whereby high electric field tends to be applied to this corner portion and when breakdown occurs, current flows from the drain and passes through a corner of the base region to the source electrode. As a result, a voltage decrease due to the current flowing in a base layer causes the potential of the base layer to decrease whereby a parasitic transistor formed by a source layer of the first conductivity type, a base layer of the second conductivity type and a substrate of the first conductivity type turns ON and may lead to element destruction.

To resolve such problems, according to one technique, on at least a lower side of the source region in the base region, a region having a high oxygen ($O_2$) concentration is provided whereby base current of a parasitic transistor formed by a source region, a base region and an epitaxial layer is blocked, suppressing operation (turn ON) of the parasitic transistor (e.g., refer to Japanese Laid-Open Patent Publication No. H05-55594). According to a further technique, below a contact region in an n-type drift layer, an $n^+$-type region is formed so as to be apart from a p-type base region whereby operation of a parasitic transistor is suppressed, enabling tolerance to be improved (e.g., refer to Japanese Laid-Open Patent Publication No. 2009-94203).

SUMMARY OF THE INVENTION

According to one aspect of the present invention, a semiconductor device includes a silicon carbide semiconductor substrate of a first conductivity type; a first silicon carbide layer of the first conductivity type provided on a front surface of the silicon carbide semiconductor substrate and having an impurity concentration lower than that of the silicon carbide semiconductor substrate; a first semiconductor region of a second conductivity type selectively provided in a surface layer on a first side of the first silicon carbide layer opposite a second side of the first silicon carbide layer facing the silicon carbide semiconductor substrate; a second semiconductor region of the first conductivity type selectively provided in a surface layer on a first side of the first semiconductor region opposite a second side of the first semiconductor region facing toward the silicon carbide semiconductor substrate; a third semiconductor region of the second conductivity type selectively provided in the surface layer on the first side of the first semiconductor region and having an impurity concentration higher than that of the first semiconductor region; a gate electrode provided, via a gate insulating film, on at least one portion of a surface of the first semiconductor region between the second semiconductor region and the first silicon carbide layer; an interlayer insulating film provided on the gate electrode; a source electrode provided on surfaces of the second semiconductor region and the third semiconductor region; and a drain electrode provided on a rear surface of the silicon carbide semiconductor substrate. The third semiconductor region is thicker than the second semiconductor region, and a width of a first side of the third semiconductor region facing the first semiconductor region is narrower than a width of a second side of the third semiconductor region facing the source electrode.

In the semiconductor device, a product of an impurity concentration of the first semiconductor region and a thickness of a region of the first semiconductor region between the third semiconductor region and the first silicon carbide layer is less than a product of the impurity concentration of the first silicon carbide layer and a thickness of a region of the first silicon carbide layer between the first semiconductor region and the silicon carbide semiconductor substrate.

In the semiconductor device, the third semiconductor region is thicker than the first semiconductor region.

In the semiconductor device, in a region of the first semiconductor region between the third semiconductor region and the first silicon carbide layer, an interface of the first semiconductor region and the first silicon carbide layer is closer to the source electrode than in other regions of the first semiconductor region and a thickness of the first semiconductor region is thinner than in the other regions of the first semiconductor region.

In the semiconductor device, a width of the region of the first semiconductor region where the thickness is thinner is wider than a width of a region of the first silicon carbide layer between the first semiconductor region and an adjacent first semiconductor region.

In the semiconductor device, a crystallographic plane index of the front surface of the silicon carbide semiconductor substrate is a plane parallel to or sloped within 10 degrees of (000-1).

In the semiconductor device, a crystallographic plane index of the front surface of the silicon carbide semiconductor substrate is a plane parallel to or sloped within 10 degrees of (0001).

According to another aspect of the present invention, a semiconductor device includes a silicon carbide semiconductor substrate of a first conductivity type; a first silicon carbide layer of the first conductivity type provided on a front surface of the silicon carbide semiconductor substrate and having an impurity concentration lower than that of the silicon carbide semiconductor substrate; a first semiconductor region of a second conductivity type selectively provided in a surface layer on a first side of the first silicon carbide layer opposite a second side of the first silicon carbide layer facing the silicon carbide semiconductor substrate; a second semiconductor region of the second conductivity type selectively provided in surfaces of the first silicon carbide layer and first semiconductor region, the second semiconductor region having an impurity concentration lower than that of the first semiconductor region; a third semiconductor region of the first conductivity type selectively provided in a surface layer on a first side of the second semiconductor region opposite a second side of the second semiconductor region facing toward the silicon carbide semiconductor substrate; a fourth semiconductor region of the second conductivity type selectively provided in the surface layer on the first side of the second semiconductor region; a fifth semiconductor region of the first conductivity type penetrating the second semiconductor region and reaching the first silicon carbide layer; a gate electrode provided, via a gate insulating film, on at least one portion of a surface of the second semiconductor region between the third semiconductor region and the fifth semiconductor region; an interlayer insulating film provided on the gate electrode; a source electrode provided on surfaces of the third semiconductor region and the fourth semiconductor region; and a drain electrode provided on a rear surface of the silicon carbide semiconductor substrate. The fourth semiconductor region is thicker than the second semiconductor region, and a width of a first side of the fourth semiconductor region facing the first semiconductor region is narrower than a width of a second side of the fourth semiconductor region facing the source electrode.

In the semiconductor device, a product of an impurity concentration of the first semiconductor region and a thickness of a region of the first semiconductor region between the fourth semiconductor region and the first silicon carbide layer is less than a product of the impurity concentration of the first silicon carbide layer and a thickness of a region of the first silicon carbide layer between the first semiconductor region and the silicon carbide semiconductor substrate.

In the semiconductor device, an interface of the fourth semiconductor region and the first semiconductor region is closer than an interface of the second semiconductor region and the first semiconductor region to the first silicon carbide layer.

In the semiconductor device, in a region of the first semiconductor region between fourth semiconductor region and the first silicon carbide layer, an interface of the first semiconductor region and the first silicon carbide layer is closer to the source electrode than in other regions of first semiconductor region and a thickness of the first semiconductor region is thinner than in the other regions of the first semiconductor region.

In the semiconductor device, a width of the region of the first semiconductor region where the thickness is thinner is wider than a width of a region of the first silicon carbide layer between the first semiconductor region and an adjacent first semiconductor region.

In the semiconductor device, a crystallographic plane index of the front surface of the silicon carbide semiconductor substrate is a plane parallel to or sloped within 10 degrees of (000-1).

In the semiconductor device, a crystallographic plane index of the front surface of the silicon carbide semiconductor substrate is a plane parallel to or sloped within 10 degrees of (0001).

According to another aspect of the present invention, a method of manufacturing a semiconductor device includes forming a first silicon carbide layer of a first conductivity type on a front surface of a silicon carbide semiconductor substrate of the first conductivity type, the first silicon carbide layer having an impurity concentration lower than that of the silicon carbide semiconductor substrate; selectively forming a first semiconductor region of a second conductivity type in a surface layer on a first side of the first silicon carbide layer opposite a second side of the first silicon carbide layer facing the silicon carbide semiconductor substrate; selectively forming a second semiconductor region of the first conductivity type in a surface layer on a first side of the first semiconductor region opposite a second side of the first semiconductor region facing the silicon carbide semiconductor substrate; selectively forming a third semiconductor region of the second conductivity type in the surface layer on the first side of the first semiconductor region, the third semiconductor region having an impurity concentration higher than that of the first semiconductor region; forming a gate electrode, via a gate insulating film, on at least one portion of a surface of the first semiconductor region between the second semiconductor region and the first silicon carbide layer; forming an interlayer insulating film on the gate electrode; forming a source electrode on surfaces of the second semiconductor region and the third semiconductor region; and forming a drain electrode on a rear surface of the silicon carbide semiconductor substrate. The third semiconductor region is formed to have a thickness thicker than that of the second semiconductor region and a width of a first side of the third semiconductor region facing the first semiconductor region is narrower than a width of a second side of the third semiconductor region facing the source electrode.

According to another aspect of the present invention, a method of manufacturing a semiconductor device includes forming a first silicon carbide layer of a first conductivity type on a front surface of a silicon carbide semiconductor substrate of the first conductivity type, the first silicon carbide layer having an impurity concentration lower than that of the silicon carbide semiconductor substrate; selectively forming a first semiconductor region of a second conductivity type in a surface layer on a first side of the first silicon carbide layer opposite a second side of the first silicon carbide layer facing the silicon carbide semiconductor substrate; selectively forming a second semiconductor region of the second conductivity type in surfaces of the first silicon carbide layer and the first semiconductor region, the second semiconductor region having an impurity concentration lower than that of first semiconductor region; selectively forming a third semiconductor region of the first conductivity type in a surface layer on a first side of the second semiconductor region opposite a second side of the second semiconductor region facing the silicon carbide semiconductor substrate; selectively forming a fourth semiconductor region of the second conductivity type in the surface layer on the first side of second semiconductor region; forming a fifth semiconductor region of the first conductivity type, the fifth semiconductor region penetrating the second semiconductor region and reaching the first silicon carbide layer; forming a gate electrode, via a gate insulating film, on at least one portion of a surface of the second semiconductor region between the third semiconductor region and the fifth semiconductor region; forming an interlayer insulating film on the gate electrode; forming a source electrode on surfaces of the third semiconductor region and the fourth semiconductor region; and forming a drain electrode on a rear surface of the silicon carbide semiconductor substrate. A thickness of the fourth semiconductor region is thicker than that of the second semiconductor region and a width of a first side of the fourth semiconductor region facing the first semiconductor region is narrower than a width of a second side of the fourth semiconductor region facing the source electrode.

Objects, features, and advantages of the present invention are specifically set forth in or will become apparent from the following detailed description of the invention when read in conjunction with the accompanying drawings.

DETAILED DESCRIPTION OF THE INVENTION

Figure 1:
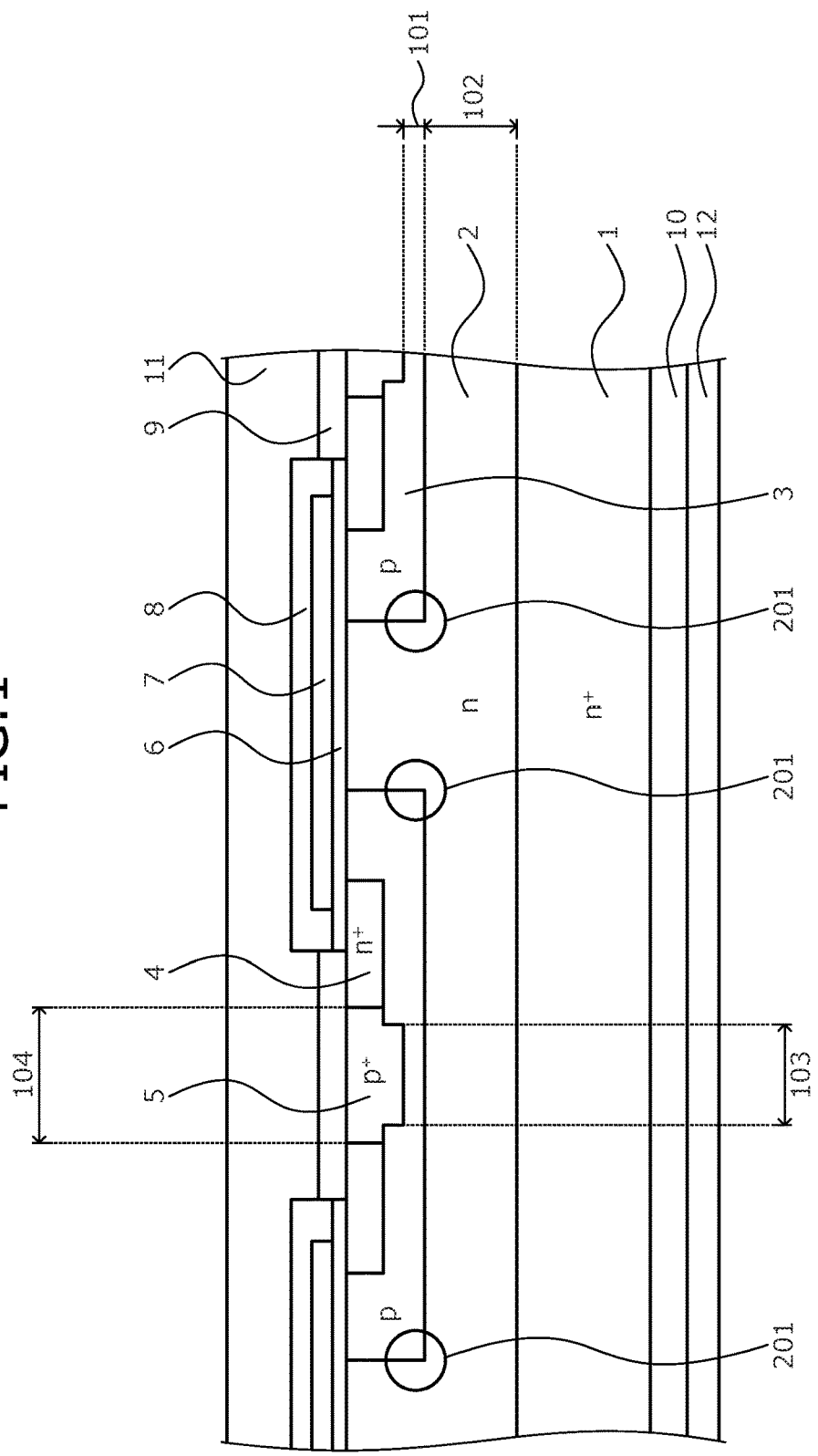
FIG. 1 is a cross-sectional view of a structure of a silicon carbide semiconductor device according to a first embodiment.

Embodiments of a semiconductor device and a method of manufacturing a semiconductor device according to the present invention will be described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −. Cases where symbols such as n's and p's that include + or − are the same indicate that concentrations are close and therefore, the concentrations are not necessarily equal. In the description of the embodiments below and the accompanying drawings, main portions that are identical will be given the same reference numerals and will not be repeatedly described. Further, —appended to p means that the impurity concentration is lower than that of p-type layers and regions appended with −. Further, in the present description, when Miller indices are described, "−" means a bar added to an index immediately after the "−", and a negative index is expressed by prefixing "−" to the index.

The semiconductor device according to the present invention uses a wide bandgap semiconductor material having a bandgap wider than that of silicon. In a first embodiment, a silicon carbide semiconductor device produced using, for example, silicon carbide (SiC) as a wide bandgap semiconductor material will be described taking a MOSFET as an example. While silicon carbide is one example of a wide bandgap semiconductor, embodiments of the invention include any wide bandgap semiconductor, including silicon dioxide, aluminum nitride, gallium nitride, boron nitride, and diamond. FIG. 1 is a cross-sectional view of a structure of the silicon carbide semiconductor device according to the first embodiment.

As depicted in FIG. 1, in the silicon carbide semiconductor device according to the first embodiment, an n-type silicon carbide epitaxial layer (a first silicon carbide layer of the first conductivity type) 2 is stacked on a main surface (front surface) of an $n^+$-type silicon carbide substrate (silicon carbide semiconductor substrate of the first conductivity type) 1.

The $n^+$-type silicon carbide substrate 1 is a silicon carbide single-crystal substrate doped with, for example, nitrogen (N). The n-type silicon carbide epitaxial layer 2 has an impurity concentration that is lower than that of the $n^+$-type silicon carbide substrate 1 and, for example, is a low-concentration n-type drift layer doped with nitrogen. Hereinafter, the $n^+$-type silicon carbide substrate 1 alone or the $n^+$-type silicon carbide substrate 1 and the n-type silicon carbide epitaxial layer 2 together are regarded as a silicon carbide semiconductor base.

As depicted in FIG. 1, in the silicon carbide semiconductor device according to the first embodiment, a rear electrode 10 is provided on a surface (rear surface of the silicon carbide semiconductor base) on a first side of the $n^+$-type silicon carbide substrate 1 that is a drain region, opposite a second side of the $n^+$-type silicon carbide substrate 1 facing the n-type silicon carbide epitaxial layer 2. The rear electrode 10 constitutes a drain electrode. Further, a rear electrode pad 12 for connection with an external device is provided.

In an active region, on the front surface side of the silicon carbide semiconductor base, an insulated gate metal oxide film semiconductor (MOS) structure (element structure) is formed. In particular, in a surface layer on a front side (front surface side) of the silicon carbide semiconductor base) of the n-type silicon carbide epitaxial layer 2 opposite a rear side of the n-type silicon carbide epitaxial layer 2 facing the $n^+$-type silicon carbide substrate 1, a p-type base region (first semiconductor region of the second conductivity type) 3 is selectively formed. The p-type base region 3 is doped with, for example, aluminum (Al).

In a portion of the p-type base region 3, an $n^+$-type source region (second semiconductor region of the first conductivity type) 4 and a $p^+$-type contact region (third semiconductor region of the second conductivity type) 5 are provided. Further, the $n^+$-type source region 4 and the $p^+$-type contact region 5 contact each other. The $n^+$-type source region 4 is arranged at an outer periphery of the $p^+$-type contact region 5. A thickness of the $p^+$-type contact region 5 is thicker than that of the $n^+$-type source region 4 and a bottom of the $p^+$-type contact region 5 is positioned at a deep portion deeper than a bottom of the $n^+$-type source region 4. The deep portion means a portion closer to the rear electrode 10. Here, a product of a thickness 101 of the p-type base region 3 between the $p^+$-type contact region 5 and the n-type silicon carbide epitaxial layer 2 and an impurity concentration of the p-type base region 3 is less than a product of a thickness 102 of the n-type silicon carbide epitaxial layer 2 positioned beneath the p-type base region 3 and an impurity concentration of the n-type silicon carbide epitaxial layer 2. In the present specification and claims, the term "product of X and Y" refers to a mathematical product obtained by multiplying numerical values. In the above, example, the product has a value with units corresponding to distance (thickness) times concentration. The n-type silicon carbide epitaxial layer 2 positioned beneath the p-type base region 3 is the n-type silicon carbide epitaxial layer 2 between the p-type base region 3 and the n$^+$-type silicon carbide substrate 1. Further, a width 103 of a lower side (side facing the p-type base region 3) of the p$^+$-type contact region 5 is narrower than a width 104 of a front side (a side facing a source electrode 9 described hereinafter) of the p$^+$-type contact region 5.

On a surface of a portion of the p-type base region 3 between the n$^+$-type source region 4 and a region on a front side of the n-type silicon carbide epitaxial layer 2 where the p-type base region 3 is not formed, a gate electrode 7 is provided via a gate insulating film 6. The gate electrode 7 may be provided, via the gate insulating film 6, on a surface of a region of the n-type silicon carbide epitaxial layer 2 where the p-type base region 3 is not formed.

In FIG. 1, only one half of a MOS structure is depicted in the active region and plural MOS structures may be arranged in parallel.

An interlayer insulating film 8 is provided on the entire front surface of the silicon carbide semiconductor base so as to cover the gate electrode 7. The source electrode 9 contacts the n$^+$-type source region 4 and the p$^+$-type contact region 5 through a contact hole opened in the interlayer insulating film 8. The source electrode 9 is electrically insulated from the gate electrode 7 by the interlayer insulating film 8. On the source electrode 9, an electrode pad 11 is provided.

Figure 2:
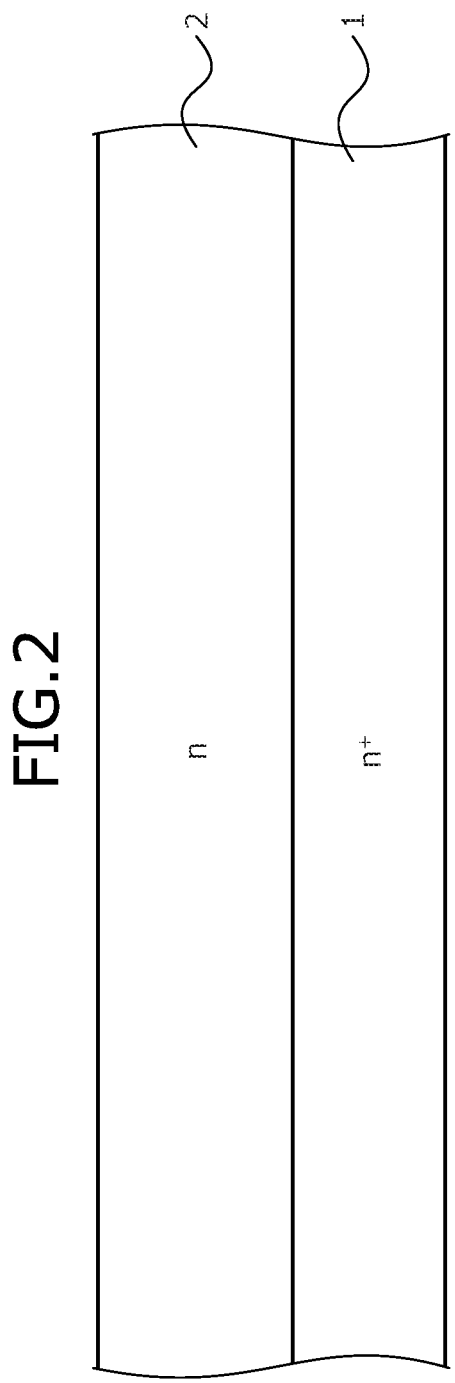
FIGS. 2, 3 and 4 are cross-sectional views of the silicon carbide semiconductor device according to the first embodiment during manufacture.
Figure 3:
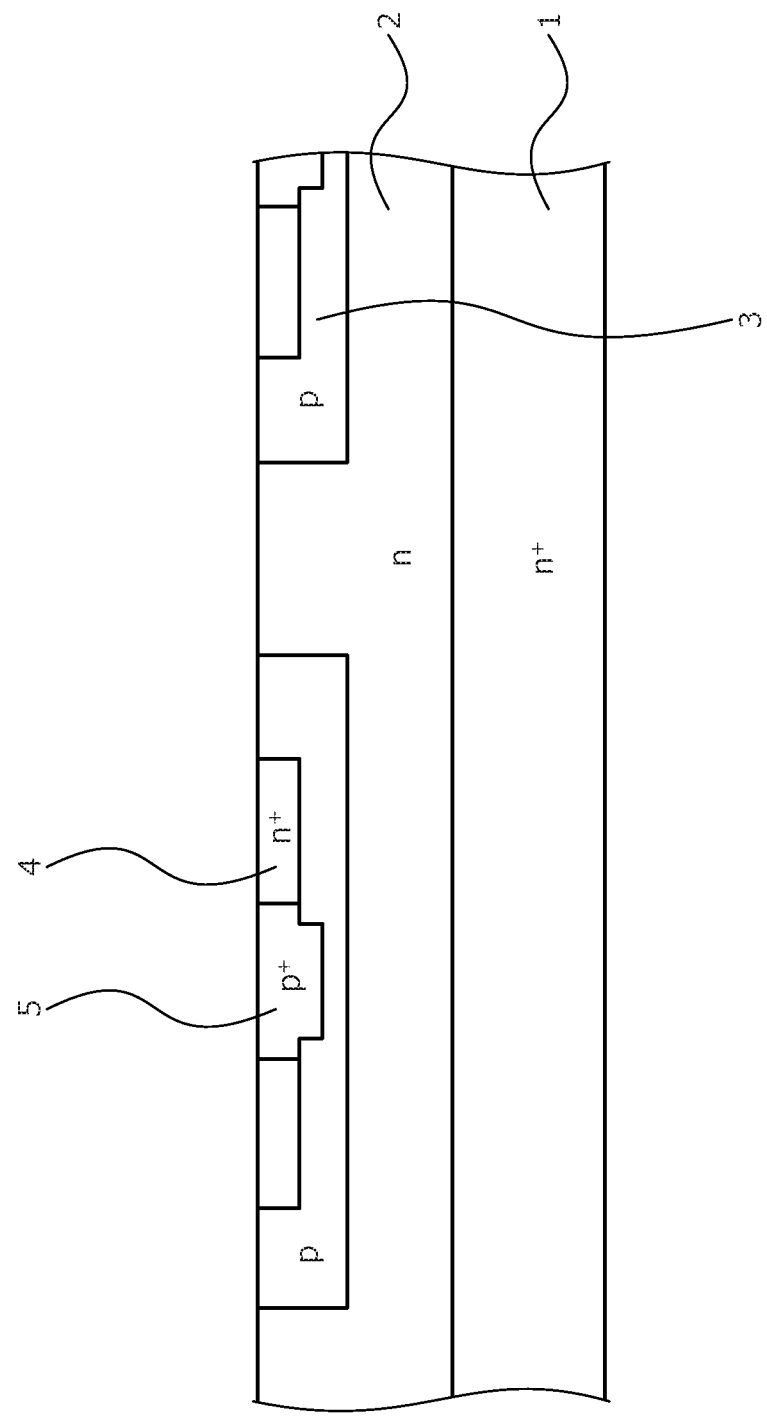
Figure 4:
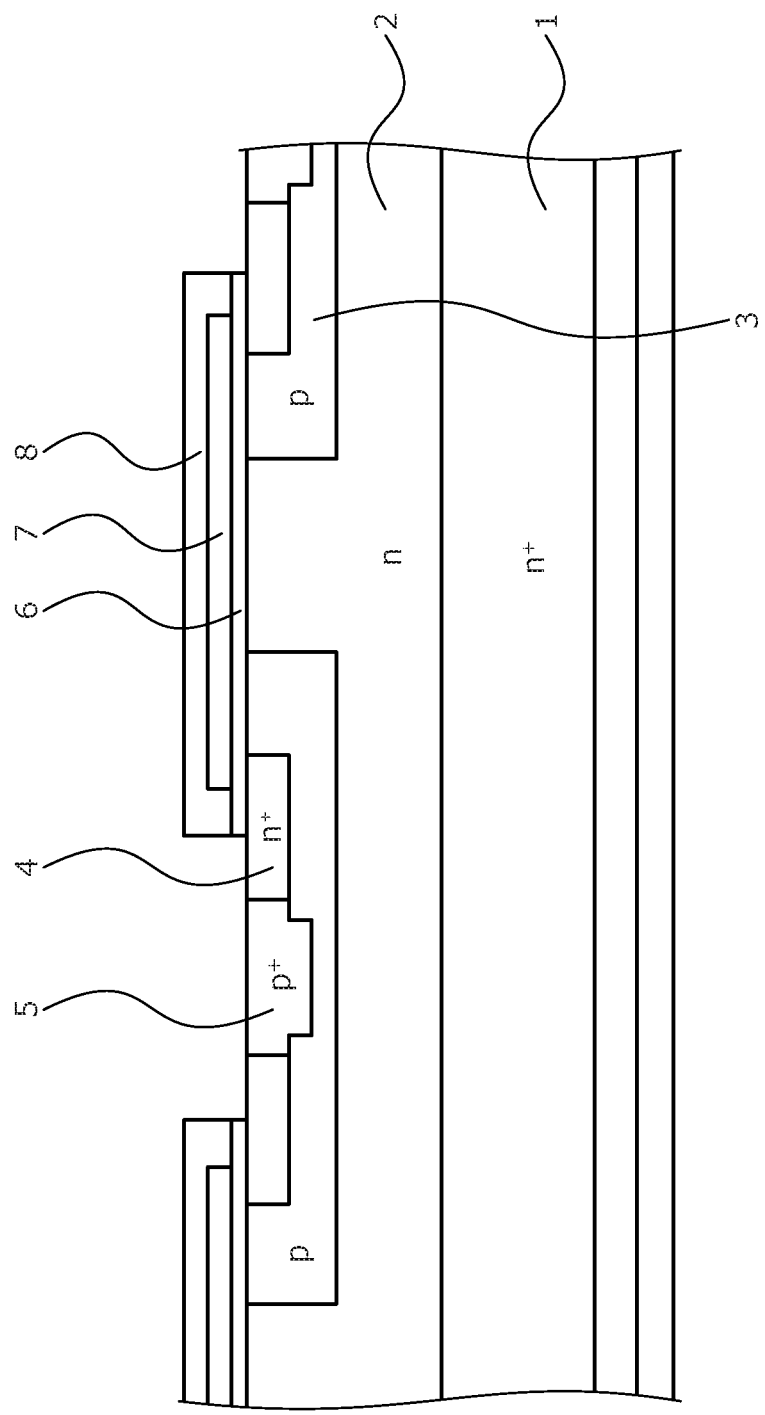

The method of manufacturing a silicon carbide semiconductor device according to the first embodiment is described taking, as an example, a case in which 1200V MOSFET is created. FIGS. 2, 3 and 4 are cross-sectional views of the silicon carbide semiconductor device according to the first embodiment during manufacture. First, for example, the n$^+$-type silicon carbide substrate 1 doped with nitrogen and having an impurity concentration of about $1\times10^{18}$ to $1\times10^{21}$/cm$^3$ is prepared. The main surface of the n$^+$-type silicon carbide substrate 1 may be, for example, a (000-1) plane having an off angle of about 4 degrees in a <11-20> direction, or may be a (0001) plane. Next, on the (000-1) plane of the n$^+$-type silicon carbide substrate 1, the n-type silicon carbide epitaxial layer 2 doped with nitrogen is formed having a thickness of 5 to 50 μm and an impurity concentration of $1.0\times10^{15}$ to $1.0\times10^{17}$/cm$^3$. Here, the structure is as depicted in FIG. 2.

Next, an oxide film mask for ion implantation is formed by photolithography and etching, and in a surface layer of the n-type silicon carbide epitaxial layer 2, the p-type base region 3 is selectively formed by ion implantation. In the ion implantation, for example, aluminum may be used as a dopant and a dose amount may be set so that an impurity concentration of the p-type base region 3 becomes $1.0\times10^{18}$ to $1.0\times10^{18}$/cm$^3$. The width and depth of the p-type base region 3 may be 5 to 20 μm and 0.2 to 3.0 μm, respectively. A distance between adjacent p-type base regions 3 may be, for example, 0.5 to 3.0 μm.

Next, in a surface layer of the p-type base region 3, the n$^+$-type source region 4 is selectively formed by photolithography and ion implantation. A depth of the n$^+$-type source region 4 may be 0.1 μm or more and may be a thickness thinner than the p-type base region 3. Next, in the surface layer of the p-type base region 3, the p$^+$-type contact region 5 is selectively formed by photolithography and ion implantation. A depth of the p$^+$-type contact region 5 may be 0.1 μm or more and may be a thickness thinner than the p-type base region 3. Here, formation is such that the product of the impurity concentration of the p-type base region 3 and the thickness 101 (refer to FIG. 1) of the p-type base region 3 between the p$^+$-type contact region 5 and the n-type silicon carbide epitaxial layer 2 is less than the product of the impurity concentration of the n-type silicon carbide epitaxial layer 2 and the thickness 102 (refer to FIG. 1) of the n-type silicon carbide epitaxial layer 2 positioned beneath the p-type base region 3.

For example, when the impurity concentration and the thickness 101 of the p-type base region 3 between the p$^+$-type contact region 5 and the n-type silicon carbide epitaxial layer 2 is $1.0\times10^{17}$/cm$^{-3}$ and 0.2 μm, respectively, the product of the concentration and the thickness is $2.0\times10^{12}$/cm$^2$. When the impurity concentration and the thickness 102 of the n-type silicon carbide epitaxial layer 2 positioned beneath the p-type base region 3 are $1.0\times10^{16}$/cm$^3$ and 9 μm, respectively, the product of the impurity concentration and the thickness is $9.0\times10^{12}$/cm$^2$, satisfying the condition above. Further, the width 104 on the surface side of the p$^+$-type contact region 5 may be 0.5 to 3.0 μm and the width 103 on the bottom side thereof may be 0.1 to 2.0 μm. Here, the structure is as depicted in FIG. 3.

Heat treatment (annealing) to activate the p-type base region 3, the n$^+$-type source region 4, and the p$^+$-type contact region 5 is performed. The temperature and processing time of the heat treatment at this time may be 1600 to 1900 degrees C. and 1 to 10 minutes, respectively.

The sequence of formation of the p-type base region 3, the n$^+$-type source region 4, and the p$^+$-type contact region 5 may be varied.

Next, as depicted in FIG. 4, the front surface side of the silicon carbide semiconductor base is thermally oxidized, forming the gate insulating film 6. A thickness at this time may be 30 to 200 nm. The thermal oxidation is performed by heat treatment in an oxygen atmosphere. The temperature of the heat treatment may be 800 to 1300 degrees C. As a result, regions formed in the p-type base region 3 and on the surface of the n-type silicon carbide epitaxial layer 2 are covered by the gate insulating film 6.

Next, on the gate insulating film 6, a polycrystalline silicon layer doped with, for example, phosphorus (P) is formed as the gate electrode 7. Next, the polycrystalline silicon layer is patterned and selectively removed, leaving the polycrystalline silicon layer on a portion of the p-type base region 3 between the n$^+$-type source region 4 and a region on the surface side of the n-type silicon carbide epitaxial layer 2 where the p-type base region 3 is not formed. At this time, on the region on the surface side of the n-type silicon carbide epitaxial layer 2 where the p-type base region 3 is not formed, the polycrystalline silicon layer may remain.

Next, for example, phosphosilicate Glass (PSG) is deposited, as the interlayer insulating film 8, so as to cover the gate electrode 7. A thickness of the interlayer insulating film 8 may be 0.5 to 2.0 μm. Next, the interlayer insulating film 8 and the gate insulating film 6 are patterned and selectively removed, forming a contact hole exposing the n$^+$-type source region 4 and the p$^+$-type contact region 5. Next, heat treatment (reflow) is performed to planarize the interlayer insulating film 8. Here, the structure is as depicted in FIG. 4.

Next, on a surface of the interlayer insulating film 8, the source electrode 9 is formed. At this time, the source electrode 9 may be embedded in the contact hole so as to contact the n$^+$-type source region 4 and the p$^+$-type contact region 5. Next, exclusive of the contact hole, the source electrode 9 is selectively removed on the active region.

Next, on a surface (the rear surface of the silicon carbide semiconductor base) of the n$^+$-type silicon carbide substrate 1, for example, a nickel film is formed as the rear electrode 10. For example, heat treatment at a temperature of 800 to 1200 degrees C. is performed, forming an ohmic junction between the n$^+$-type silicon carbide substrate 1 and the rear electrode 10. Next, for example, the electrode pad 11 is deposited on the entire front surface of the silicon carbide semiconductor base by sputtering so as to cover the source electrode 9 and the interlayer insulating film 8 of the active region. A thickness of a portion of the electrode pad 11 on the interlayer insulating film 8 may be, for example, 1 to 10 µm. The electrode pad 11, for example, may be formed to by aluminum (Al—Si) containing silicon at a rate of 1%. Next, the electrode pad 11 is selectively removed.

Next, on a surface of the rear electrode 10, for example, titanium, nickel, and gold (Au) are sequentially deposited as the rear electrode pad 12 whereby the MOSFET depicted in FIG. 1 is completed.

As described, according to the silicon carbide semiconductor device according to the first embodiment, due to the structure described above, when high voltage is applied to the drain electrode side, a concentration of electric field beneath the p$^+$-type contact region occurs whereby avalanche current flows from beneath the p$^+$-type contact region. As a result, operation of a parasitic transistor caused by current that is from the source electrode to a corner portion of the p-type base region and due to breakdown occurring due to electric field concentration at the corner portion of the p-type base region may be prevented, enabling element breakdown to be prevented.

Figure 5:
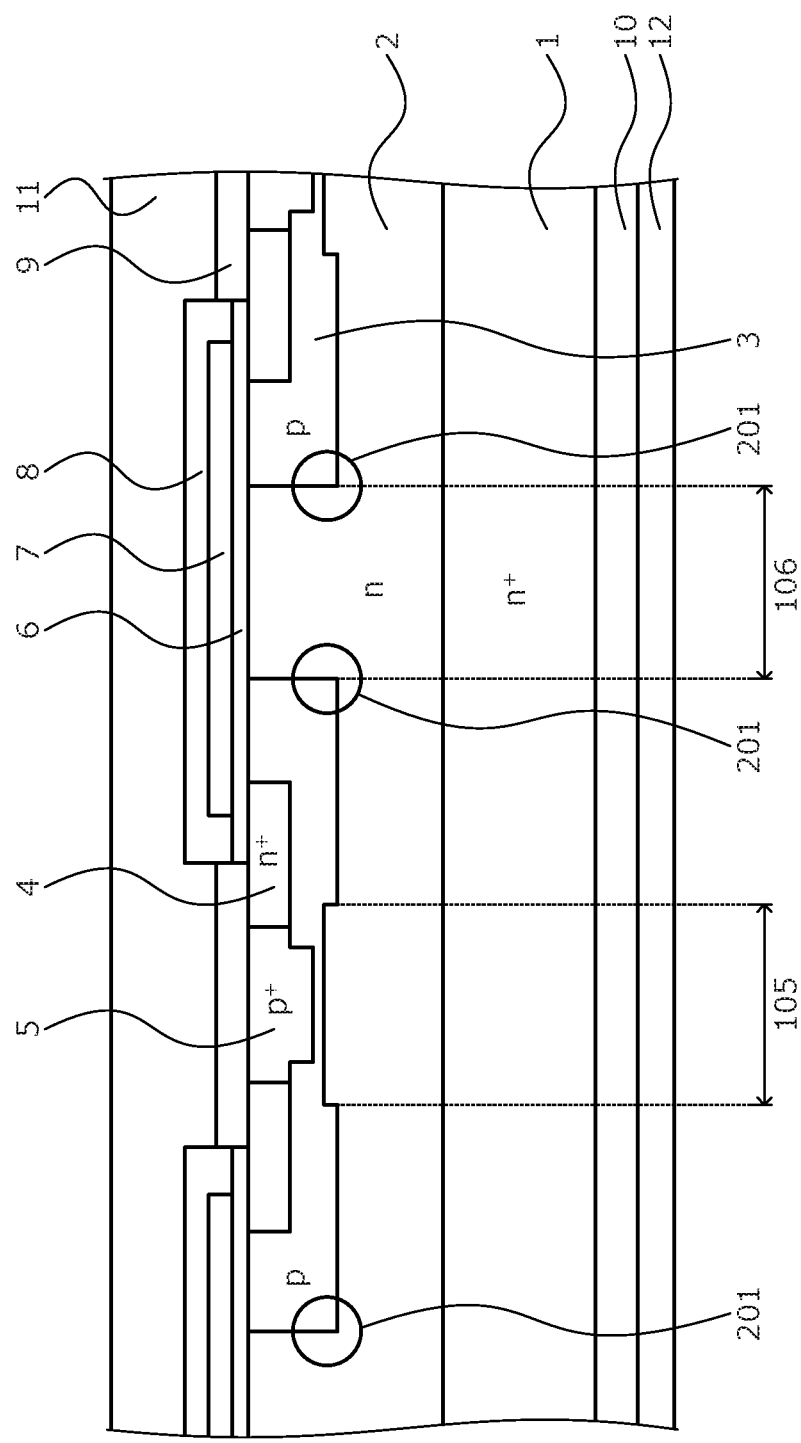
FIG. 5 is a cross-sectional view of a structure of the silicon carbide semiconductor device according to a second embodiment.

FIG. 5 is a cross-sectional view of a structure of the silicon carbide semiconductor device according to a second embodiment. The basic structure of the semiconductor device according to the present embodiment is substantially identical to that of the semiconductor device described in the first embodiment and therefore, only differing parts will be described and redundant description will be omitted.

As depicted in FIG. 5, in the second embodiment, in a region of the p-type base region 3 between the p$^+$-type contact region 5 and the n-type silicon carbide epitaxial layer 2, an interface of the p-type base region 3 and the n-type silicon carbide epitaxial layer 2 is closer to the source electrode 9 than in other regions of the p-type base region 3. Therefore, the structure is such that beneath the region of the p-type base region 3 where the p$^+$-type contact region 5 provided, the p-type base region 3 is thinner than at other regions of the p-type base region 3. Further, a width 105 of the region of the thin structure of the p-type base region 3 may be wider than a width 106 of the n-type silicon carbide epitaxial layer 2 between adjacent p-type base regions 3.

According to the silicon carbide semiconductor device according to the second embodiment, effects identical to those of the silicon carbide semiconductor device according to the first embodiment are achieved.

Figure 6:
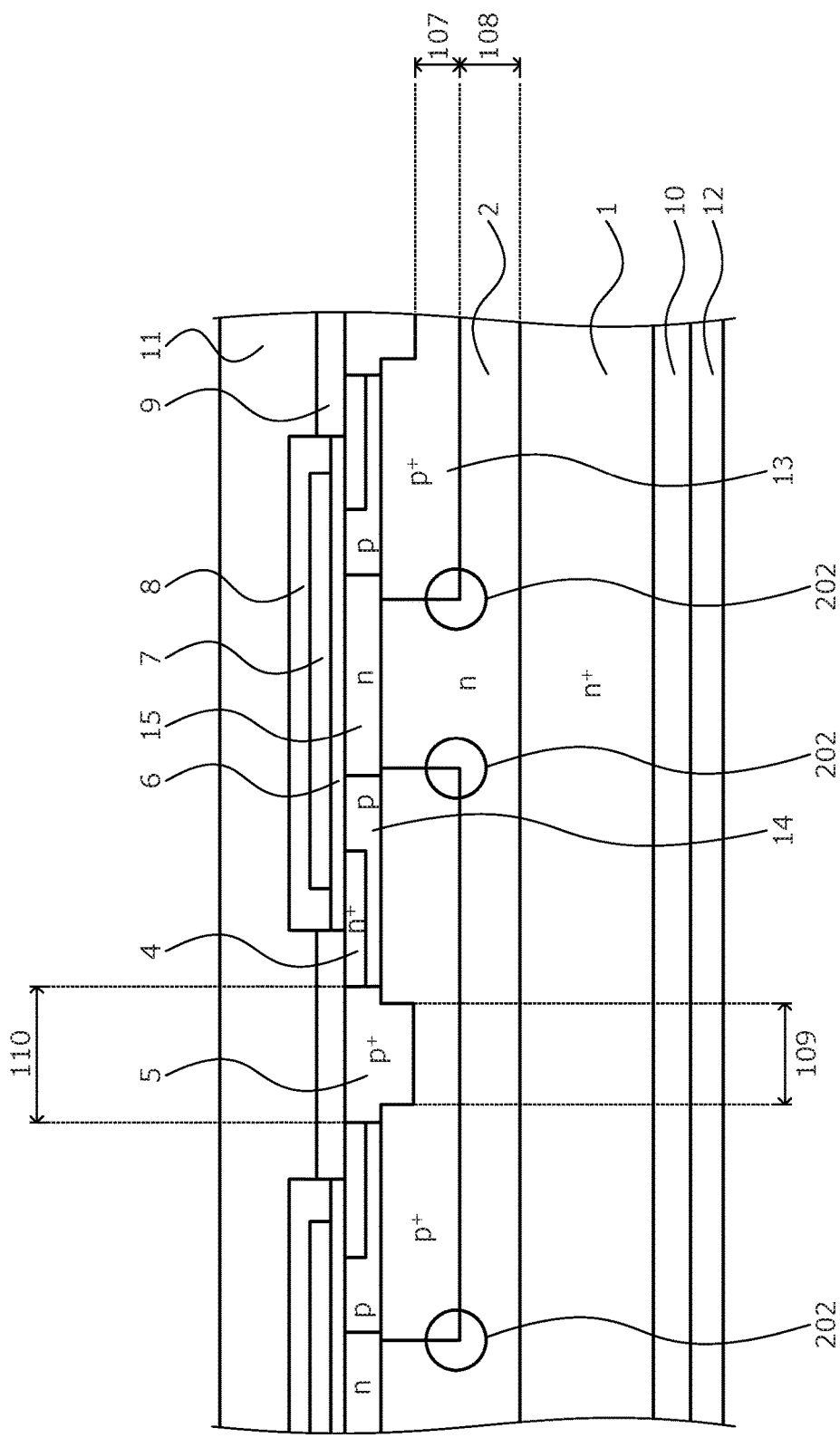
FIG. 6 is a cross-sectional view of a structure of the silicon carbide semiconductor device according to a third embodiment.

FIG. 6 is a cross-sectional view of a structure of the silicon carbide semiconductor device according to a third embodiment. As depicted in FIG. 6, in the silicon carbide semiconductor device according to the third embodiment, on the main surface of the n$^+$-type silicon carbide substrate (silicon carbide semiconductor substrate of the first conductivity type) 1, the n-type silicon carbide epitaxial layer (the first silicon carbide layer of the first conductivity type) 2 is deposited.

The n$^+$-type silicon carbide substrate 1 is, for example, a silicon carbide single-crystal substrate doped with nitrogen (N). The n-type silicon carbide epitaxial layer 2 is a low-concentration n-type drift layer doped with, for example, nitrogen and having an impurity concentration lower than that of the n$^+$-type silicon carbide substrate 1. Hereinafter, the n$^+$-type silicon carbide substrate 1 alone or the n$^+$-type silicon carbide substrate 1 and the n-type silicon carbide epitaxial layer 2 together are regarded as the silicon carbide semiconductor base.

As depicted in FIG. 6, in the silicon carbide semiconductor device according to the third embodiment, the rear electrode 10 is provided on the surface (the rear surface of the silicon carbide semiconductor base) on the first side of the n$^+$-type silicon carbide substrate 1 that is a drain region, opposite the second side of the n$^+$-type silicon carbide substrate 1 facing the n-type silicon carbide epitaxial layer 2. The rear electrode 10 constitutes the drain electrode. Further, the rear electrode pad 12 for connection with an external device is provided.

In the active region, on the front surface side of the silicon carbide semiconductor base, the MOS structure (element structure) is formed. In particular, in the surface layer on the front side (the front surface side of the silicon carbide semiconductor base) of the n-type silicon carbide epitaxial layer 2 opposite the rear side thereof facing the n$^+$-type silicon carbide substrate 1, a p$^+$-type base region (first semiconductor region of the second conductivity type) 13 is selectively provided. The p$^+$-type base region 13, for example, is doped with aluminum.

In surfaces of adjacent p$^+$-type base regions 13 and a surface of the n-type silicon carbide epitaxial layer 2 between the adjacent p$^+$-type base regions 13, a p-type silicon carbide epitaxial layer (hereinafter, p-type base layer, second semiconductor region of the second conductivity type) 14 is selectively deposited. An impurity concentration of the p-type base layer 14 is lower than an impurity concentration of the p$^+$-type base region 13. The p-type base layer 14, for example, may be doped with aluminum.

In the surface of the p-type base layer 14 on the p$^+$-type base region 13, the n$^+$-type source region (third semiconductor region of the first conductivity type) 4 and the p$^+$-type contact region (fourth semiconductor region of the second conductivity type) 5 are provided. Further, the n$^+$-type source region 4 and the p$^+$-type contact region 5 contact each other. The n$^+$-type source region 4 is arranged at the outer periphery of the p$^+$-type contact region 5. Here, a product of the impurity concentration of the p$^+$-type base region 13 and a thickness 107 of the p$^+$-type base region 13 between the p$^+$-type contact region 5 and the n-type silicon carbide epitaxial layer 2 is less than a product of the impurity concentration of the n-type silicon carbide epitaxial layer 2 and a thickness 108 of the n-type silicon carbide epitaxial layer 2 positioned beneath the p$^+$-type base region 13. The n-type silicon carbide epitaxial layer 2 positioned beneath the p$^+$-type base region 13 is the n-type silicon carbide epitaxial layer 2 between the p$^+$-type base region 13 and the n$^+$-type silicon carbide substrate 1.

Further, in a portion of the p-type base layer 14 on the n-type silicon carbide epitaxial layer 2, an n-type well region (fifth semiconductor region of the first conductivity type) 15 is provided penetrating the p-type base layer 14 in a depth direction to reach the n-type silicon carbide epitaxial layer 2. The n-type well region 15 and the n-type silicon carbide epitaxial layer 2 constitute a drift region. On a surface of a portion of the p-type base layer 14 between the n+-type source region 4 and the n-type well region 15, the gate electrode 7 is provided via the gate insulating film 6. The gate electrode 7 may be provided on a surface of the n-type well region 15 via the gate insulating film 6.

In FIG. 6, only one half of the MOS structure is depicted in the active region and plural MOS structures may be arranged in parallel.

The interlayer insulating film 8 is provided on the entire front surface of the silicon carbide semiconductor base so as to cover the gate electrode 7. The source electrode 9 contacts the n+-type source region 4 and the p+-type contact region 5 through the contact hole opened in the interlayer insulating film 8. The source electrode 9 is electrically insulated from the gate electrode 7 by the interlayer insulating film 8. On the source electrode 9, the electrode pad 11 is provided.

Figure 7:
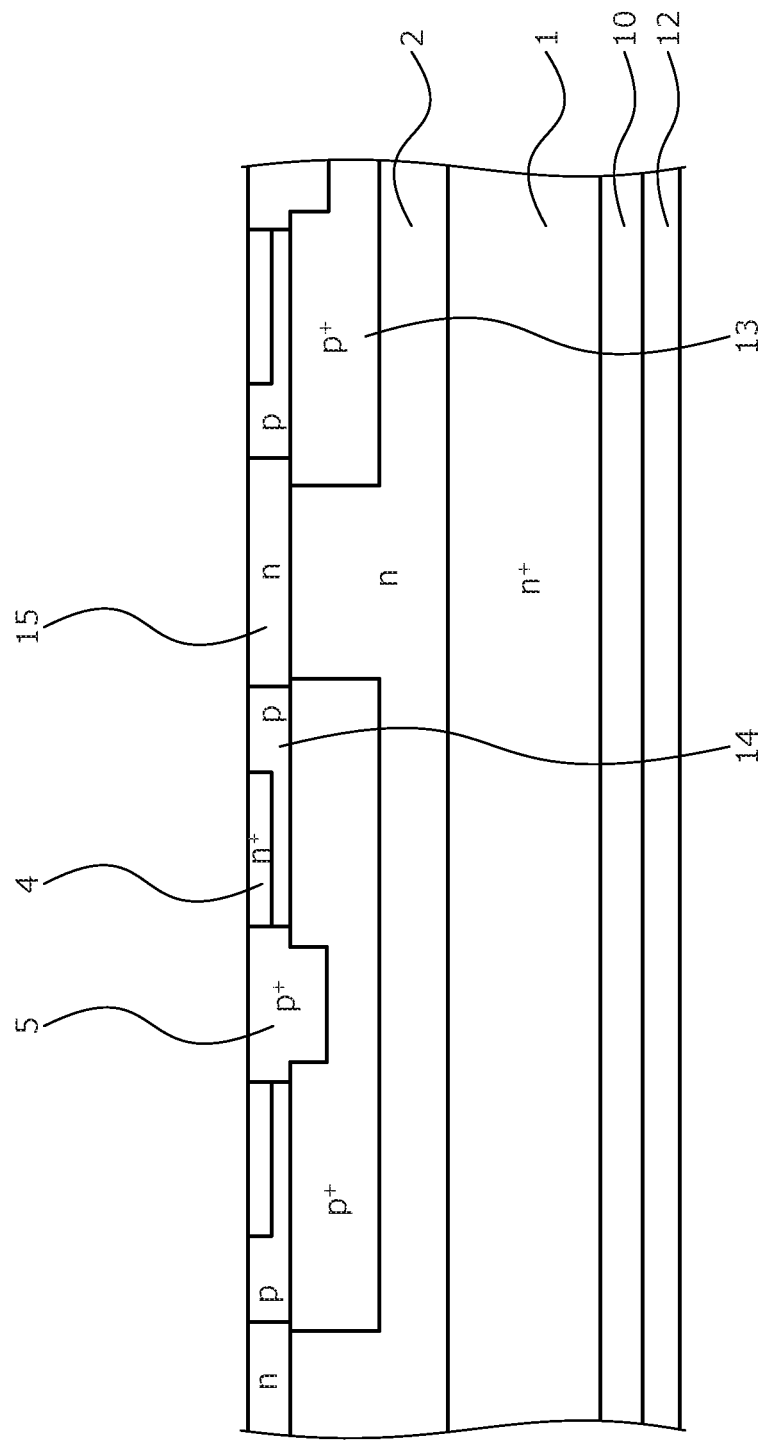
FIGS. 7 and 8 are cross-sectional views of the silicon carbide semiconductor device according to the third embodiment during manufacture.
Figure 8:
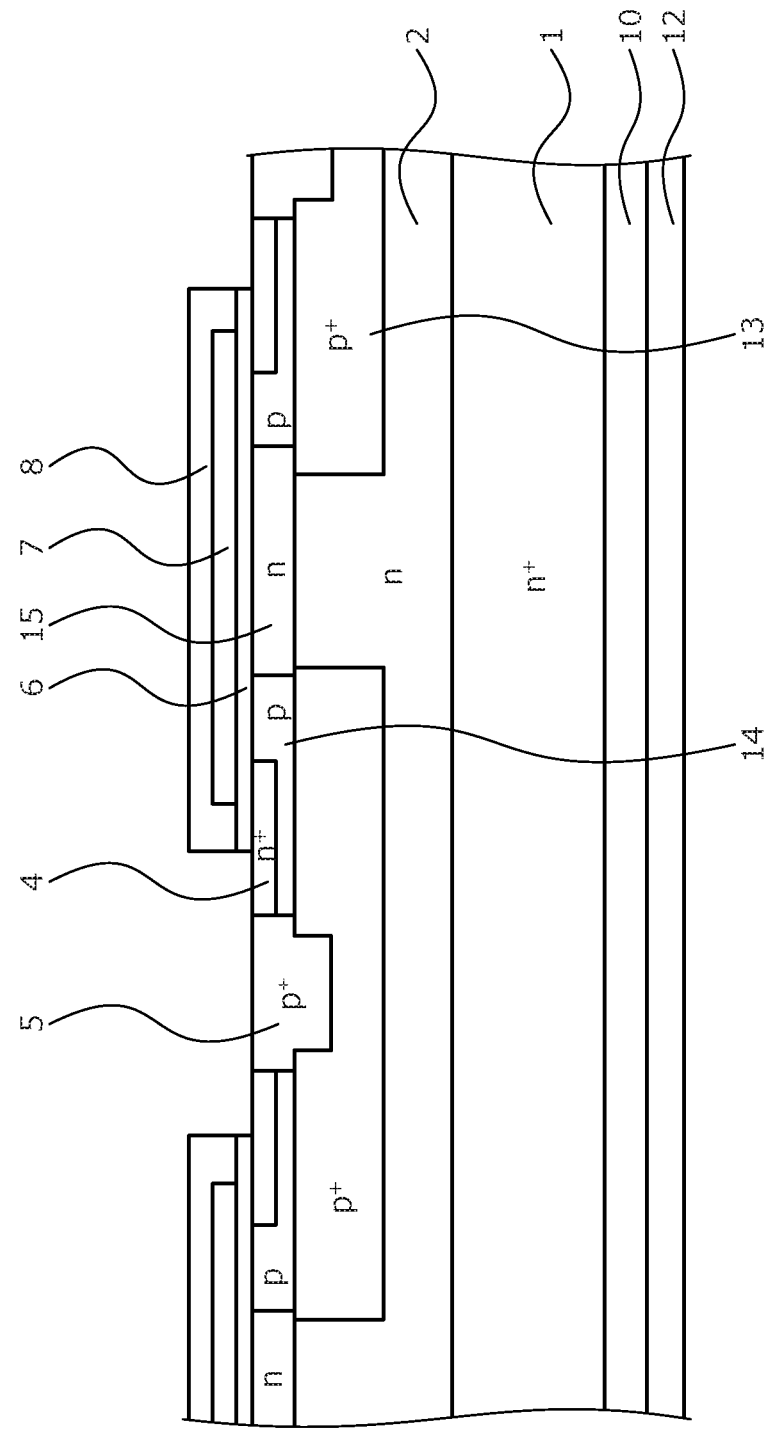

The method of manufacturing a silicon carbide semiconductor device according to the third embodiment is described taking, as an example, a case in which a 1200V MOSFET is created. FIGS. 7 and 8 are cross-sectional views of the silicon carbide semiconductor device according to the third embodiment during manufacture. First, for example, the n+-type silicon carbide substrate 1 doped with nitrogen and having an impurity concentration of about $1\times10^{18}$ to $1\times10^{21}/cm^3$ is prepared. The main surface of the n+-type silicon carbide substrate 1 may be, for example, a (000-1) plane having an off angle of about 4 degrees in a <11-20> direction, or may be a (0001) plane. Next, on the (000-1) plane of the n+-type silicon carbide substrate 1, the n-type silicon carbide epitaxial layer 2 (refer to FIG. 2 of the first embodiment) doped with nitrogen is formed having a thickness of 5 to 50 µm and an impurity concentration of $1.0\times10^{15}$ to $1.0\times10^{17}/cm^3$.

Next, an oxide film mask for ion implantation is formed by photolithography and etching, and in the surface layer of the n-type silicon carbide epitaxial layer 2, the p+-type base region 13 is selectively formed by ion implantation. In the ion implantation, for example, aluminum may be used as a dopant and a dose amount may be set so that an impurity concentration of the p+-type base region 13 becomes $1.0\times10^{17}$ to $5.0\times10^{19}/cm^3$. The width and depth of the p+-type base region 13 may be 5 to 20 µm and 0.2 to 3.0 µm, respectively. The distance between adjacent p+-type base regions 13 may be, for example, 0.5 to 3.0 µm.

Next, on a surface of the n-type silicon carbide epitaxial layer 2, a p-type silicon carbide epitaxial layer to become the p-type base layer 14 is grown to have a thickness of, for example, 0.2 to 1.0 µm. At this time, for example, a p-type silicon carbide epitaxial layer doped with aluminum so that the impurity concentration of the p-type base layer 14 becomes $1.0\times10^{15}$ to $1.0\times10^{17}/cm^3$ may be grown.

Next, the conductivity type of a portion of the p-type base layer 14 on the n-type silicon carbide epitaxial layer 2 is inverted by photolithography and ion implantation, selectively forming the n-type well region 15. The width and depth of the n-type well region 15 may be 0.2 to 3.0 µm and 0.2 to 2.0 µm, respectively.

Next, in a surface layer of the p-type base layer 14 on the p+-type base region 13, the n+-type source region 4 is selectively formed by photolithography and ion implantation. Next, in the surface layer of the p-type base layer 14 on the p+-type base region 13, the p+-type contact region 5 is selectively formed by photolithography and ion implantation. The thickness of the p+-type contact region 5 may be a thickness of 0.1 µm or more where a position of a bottom of the p+-type contact region 5 is closer than a position of a bottom of the p-type base region 13 to the surface. Here, formation is such that a product of the impurity concentration of the p-type base region 13 and the thickness 107 of the p-type base region 13 between the p+-type contact region 5 and the n-type silicon carbide epitaxial layer 2 is less than a product of the impurity concentration of the n-type silicon carbide epitaxial layer 2 and the thickness 108 of the n-type silicon carbide epitaxial layer 2 positioned beneath the p-type base region 13.

For example, when the impurity concentration and the thickness 107 of the p-type base region 13 between the p+-type contact region 5 and the n-type silicon carbide epitaxial layer 2 are $1.0\times10^{18}/cm^3$ and 0.05 µm, respectively, the product of the impurity concentration and the thickness is $5.0\times10^{12}/cm^2$ and when the impurity concentration and the thickness 108 of the n-type silicon carbide epitaxial layer 2 positioned beneath the p-type base region 3 are $1.0\times10^{16}/cm^3$ and 10 µm, respectively, the product of the impurity concentration and the thickness is $1.0\times10^{13}/cm^2$, satisfying the condition above. Further, a width 110 (refer to FIG. 6) on the surface side of the p+-type contact region 5 may be 0.5 to 3.0 µm and a width 109 (refer to FIG. 6) on the bottom side thereof may be 0.1 to 2.0 µm. Here, the structure is as depicted in FIG. 7.

Heat treatment (annealing) for activating the p+-type base region 13, the n+-type source region 4, the p+-type contact region 5, and the n-type well region 15 is performed. The temperature and processing time of the heat treatment at this time may be 1600 to 1900 degrees C. and 1 to 10 minutes, respectively.

The sequence of formation of the p+-type base region 13, the n+-type source region 4, the p+-type contact region 5, and the n-type well region 15 may be varied.

Next, the front surface side of silicon carbide semiconductor base is thermally oxidized, forming the gate insulating film 6 having a thickness of 30 to 200 nm. The thermal oxidation may be performed by performing heat treatment at 800 to 1300 degrees C. in an oxygen atmosphere. As a result, regions formed in the p-type base layer 14 and on the surface of the n-type silicon carbide epitaxial layer 2 are covered by the gate insulating film 6.

Next, for example, a polycrystalline silicon layer doped with phosphorus (P) is formed on the gate insulating film 6 as the gate electrode 7. Next, the polycrystalline silicon layer is patterned and selectively removed, leaving the polycrystalline silicon layer on a portion of the p-type base layer 14 between the n+-type source region 4 and the n-type well region 15. At this time, the polycrystalline silicon layer may remain on the n-type well region 15.

Next, for example, phosphosilicate Glass (PSG) is deposited, as the interlayer insulating film 8, so as to cover the gate insulating film 6. A thickness of the interlayer insulating film 8 may be 0.5 to 2.0 µm. Next, the interlayer insulating film 8 and the gate insulating film 6 are patterned and selectively removed, forming the contact hole exposing the n+-type source region 4 and the p+-type contact region 5. Next, heat treatment (reflow) is performed to planarize the interlayer insulating film 8. Here, the structure is as depicted in FIG. 8.

Next, on a surface of the interlayer insulating film 8, the source electrode 9 is formed. At this time, the source electrode 9 may be embedded in the contact hole so as to contact the n+-type source region 4 and the p+-type contact region 5. Next, exclusive of the contact hole, the source electrode 9 is selectively removed.

Next, on a surface (the rear surface of the silicon carbide semiconductor base) of the n+-type silicon carbide substrate 1, for example, a nickel film is formed as the rear electrode 10. For example, heat treatment at a temperature of 800 to 1200 degrees C. is performed, forming an ohmic junction between the n$^+$-type silicon carbide substrate 1 and the rear electrode 10. Next, for example, the electrode pad 11 is deposited on the entire front surface of the silicon carbide semiconductor base by sputtering so as to cover the source electrode 9 and the interlayer insulating film 8 of the active region. A thickness of a portion of the electrode pad 11 on the interlayer insulating film 8 may be, for example, 1 to 10 μm. The electrode pad 11, for example, may be formed to by aluminum (Al—Si) containing silicon at a rate of 1%. Next, the electrode pad 11 is selectively removed. Next, on a surface of the rear electrode 10, for example, titanium, nickel, and gold are sequentially deposited as the rear electrode pad 12 whereby the MOSFET depicted in FIG. 6 is completed.

According to the silicon carbide semiconductor device according to the third embodiment, effects identical to those of the silicon carbide semiconductor device according to the first embodiment are achieved.

Figure 9:
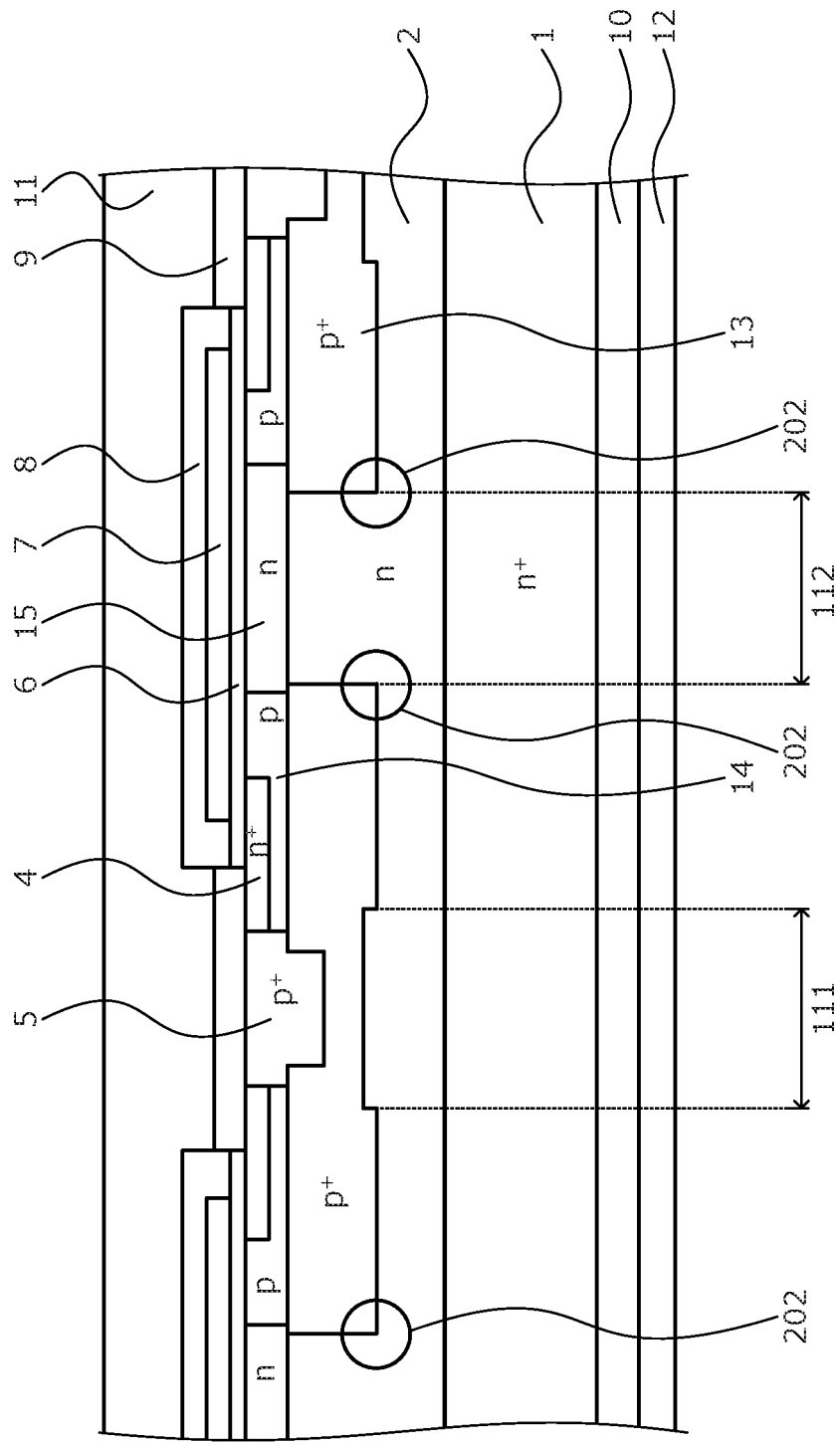
FIG. 9 is a cross-sectional view of a structure of the silicon carbide semiconductor device according to a fourth embodiment.

FIG. 9 is a cross-sectional view of a structure of the silicon carbide semiconductor device according to a fourth embodiment. The basic structure of the semiconductor device according to the fourth embodiment is substantially identical to that of the semiconductor device described in the third embodiment and therefore, only differing parts will be described and redundant description will be omitted.

As depicted in FIG. 9, in the fourth embodiment, in a region of the p$^+$-type base region 13 between the p$^+$-type contact region 5 and the n-type silicon carbide epitaxial layer 2, an interface of the p$^+$-type base region 13 and the n-type silicon carbide epitaxial layer 2 is closer than in other regions of the p$^+$-type base region 13 to the source electrode 9. Therefore, the structure is such that beneath the region of the p$^+$-type base region 13 where the p$^+$-type contact region 5 is provided, the p$^+$-type base region 13 is thinner than at other regions of the p$^+$-type base region 13. Further, a width 111 of the region of the thin structure of the p$^+$-type base region 13 may be wider than a width 112 of the n-type silicon carbide epitaxial layer 2 between adjacent p$^+$-type base regions 13.

According to the silicon carbide semiconductor device according to the fourth embodiment, effects identical to those of the silicon carbide semiconductor device according to the first embodiment are achieved.

Although description has been described taking, as an example, a case in which the main surface of a silicon carbide substrate containing silicon carbide is a (000-1) plane and on the (000-1) plane, a MOSFET is formed, the present invention is not limited hereto and the plane orientation of the substrate main surface, etc. may be variously changed.

Further, in the present invention, although description of the edge termination structure has been omitted, a junction termination extension (JTE) structure, or irrespective of the difficulty of manufacturing, an edge termination structure of a configuration in which plural p-type regions are arranged at predetermined intervals such as afield limiting ring (FLR) structure may be applied to the present invention. Further, in each of the embodiments, although the first conductivity type is assumed as an n-type and the second conductivity type is assumed as a p-type, the present invention is similarly implemented when the first conductivity type is a p-type and the second conductivity type is an n-type.

Nonetheless, the technique described in Japanese Laid-Open Patent Publication No. H05-55594 is an ordinary diffusion process for a silicon (Si) device and application to the manufacture of a SiC semiconductor device having a high diffusion coefficient is difficult. Further, with the technique described in Japanese Laid-Open Patent Publication No. 2009-94203, realization of a process for forming a concentrated region in a SiC substrate is extremely difficult.

According to the present invention, by the structure described above, when high voltage is applied to the drain electrode side, a concentration of electric field occurs beneath the p$^+$-type contact region (third semiconductor region of the second conductivity type) whereby avalanche current flows from beneath the p$^+$-type contact region. As a result, operation of a parasitic transistor caused by current that is from the source electrode to a corner portion of the p-type base region and due to breakdown occurring due to a concentration of electric field at a corner portion of the p-type base region (the first semiconductor region of the second conductivity type) may be prevented, enabling element breakdown to be prevented.

The semiconductor device and the method of manufacturing a semiconductor device according to the present invention achieve an effect in that operation of a parasitic transistor may be suppressed and a structure that may be formed easily is realized.

As described, the semiconductor device and the method of manufacturing a semiconductor device according to the present invention are useful for high-voltage semiconductor devices used in power converting equipment and power supply devices such as in various industrial machines.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:
1. A semiconductor device comprising:
a silicon carbide semiconductor substrate of a first conductivity type;
a first silicon carbide layer of the first conductivity type provided on a front surface of the silicon carbide semiconductor substrate and having an impurity concentration lower than that of the silicon carbide semiconductor substrate;
a first semiconductor region of a second conductivity type selectively provided in a surface layer on a first side of the first silicon carbide layer opposite a second side of the first silicon carbide layer facing the silicon carbide semiconductor substrate;
a second semiconductor region of the first conductivity type selectively provided in a surface layer on a first side of the first semiconductor region opposite a second side of the first semiconductor region facing toward the silicon carbide semiconductor substrate;
a third semiconductor region of the second conductivity type selectively provided in the surface layer on the first side of the first semiconductor region and having an impurity concentration higher than that of the first semiconductor region;
a gate electrode provided, via a gate insulating film, on at least one portion of a surface of the first semiconductor region between the second semiconductor region and the first silicon carbide layer;
an interlayer insulating film provided on the gate electrode;

a source electrode provided on surfaces of the second semiconductor region and the third semiconductor region; and a drain electrode provided on a rear surface of the silicon carbide semiconductor substrate, wherein the third semiconductor region is thicker, in a depth direction, than the second semiconductor region, and a width of a first side of the third semiconductor region facing the first semiconductor region is narrower than a width of a second side of the third semiconductor region facing the source electrode, wherein a result of multiplying an impurity concentration of the first semiconductor region by a thickness of a region of the first semiconductor region between the third semiconductor region and the first silicon carbide layer is less than a result of multiplying the impurity concentration of the first silicon carbide layer by a thickness of a region of the first silicon carbide layer between the first semiconductor region and the silicon carbide semiconductor substrate.

2. The semiconductor device according to claim 1, wherein the third semiconductor region is thicker, in the depth direction, than the first semiconductor region.

3. The semiconductor device according to claim 1, wherein in a region of the first semiconductor region between the third semiconductor region and the first silicon carbide layer, an interface of the first semiconductor region and the first silicon carbide layer is closer to the source electrode than in other regions of the first semiconductor region and a thickness of the first semiconductor region, in the depth direction, is thinner than in the other regions of the first semiconductor region.

4. The semiconductor device according to claim 3, wherein a width of the region of the first semiconductor region where the thickness is thinner than in other regions of the first semiconductor region is wider than a width of a region of the first silicon carbide layer between the first semiconductor region and an adjacent first semiconductor region.

5. The semiconductor device according to claim 1, wherein a crystallographic plane index of the front surface of the silicon carbide semiconductor substrate is a plane parallel to or sloped within 10 degrees of (000-1).

6. The semiconductor device according to claim 1, wherein a crystallographic plane index of the front surface of the silicon carbide semiconductor substrate is a plane parallel to or sloped within 10 degrees of (0001).

7. A semiconductor device comprising:

a silicon carbide semiconductor substrate of a first conductivity type;

a first silicon carbide layer of the first conductivity type provided on a front surface of the silicon carbide semiconductor substrate and having an impurity concentration lower than that of the silicon carbide semiconductor substrate;

a first semiconductor region of a second conductivity type selectively provided in a surface layer on a first side of the first silicon carbide layer opposite a second side of the first silicon carbide layer facing the silicon carbide semiconductor substrate;

a second semiconductor region of the second conductivity type selectively provided in surfaces of the first silicon carbide layer and first semiconductor region, the second semiconductor region having an impurity concentration lower than that of the first semiconductor region;

a third semiconductor region of the first conductivity type selectively provided in a surface layer on a first side of the second semiconductor region opposite a second side of the second semiconductor region facing toward the silicon carbide semiconductor substrate;

a fourth semiconductor region of the second conductivity type selectively provided in the surface layer on the first side of the second semiconductor region;

a fifth semiconductor region of the first conductivity type penetrating the second semiconductor region and reaching the first silicon carbide layer;

a gate electrode provided, via a gate insulating film, on at least one portion of a surface of the second semiconductor region between the third semiconductor region and the fifth semiconductor region;

an interlayer insulating film provided on the gate electrode;

a source electrode provided on surfaces of the third semiconductor region and the fourth semiconductor region; and a drain electrode provided on a rear surface of the silicon carbide semiconductor substrate, wherein the fourth semiconductor region is thicker, in a depth direction, than the second semiconductor region, and a width of a first side of the fourth semiconductor region facing the first semiconductor region is narrower than a width of a second side of the fourth semiconductor region facing the source electrode.

8. The semiconductor device according to claim 7, wherein a result of multiplying an impurity concentration of the first semiconductor region by a thickness of a region of the first semiconductor region between the fourth semiconductor region and the first silicon carbide layer is less than a result of multiplying the impurity concentration of the first silicon carbide layer by a thickness of a region of the first silicon carbide layer between the first semiconductor region and the silicon carbide semiconductor substrate.

9. The semiconductor device according to claim 7, wherein an interface of the fourth semiconductor region and the first semiconductor region is closer to the first silicon carbide layer than an interface of the second semiconductor region and the first semiconductor region.

10. The semiconductor device according to claim 7, wherein in a region of the first semiconductor region between the fourth semiconductor region and the first silicon carbide layer, an interface of the first semiconductor region and the first silicon carbide layer is closer to the source electrode than in other regions of first semiconductor region and a thickness of the first semiconductor region, in the depth direction, is thinner than in the other regions of the first semiconductor region.

11. The semiconductor device according to claim 10, wherein a width of the region of the first semiconductor region where the thickness is thinner than in the other regions of the first semiconductor region is wider than a width of a region of the first silicon carbide layer between the first semiconductor region and an adjacent first semiconductor region.

12. The semiconductor device according to claim 7, wherein
 a crystallographic plane index of the front surface of the silicon carbide semiconductor substrate is a plane parallel to or sloped within 10 degrees of (000-1).

13. The semiconductor device according to claim 7, wherein
 a crystallographic plane index of the front surface of the silicon carbide semiconductor substrate is a plane parallel to or sloped within 10 degrees of (0001).

\* \* \* \* \*